United States Patent
Børstad

(10) Patent No.: US 11,283,418 B2
(45) Date of Patent: Mar. 22, 2022

(54) AUDIO AMPLIFIERS

(71) Applicant: Elliptic Laboratories AS, Oslo (NO)

(72) Inventor: Thomas Kristoffersen Børstad, Oslo (NO)

(73) Assignee: Elliptic Laboratories AS, Oslo (NO)

( * ) Notice: Subject to any disclaimer, the term of this patent is extended or adjusted under 35 U.S.C. 154(b) by 0 days.

(21) Appl. No.: 16/955,025

(22) PCT Filed: Dec. 19, 2018

(86) PCT No.: PCT/GB2018/053680
§ 371 (c)(1),
(2) Date: Jun. 17, 2020

(87) PCT Pub. No.: WO2019/122864
PCT Pub. Date: Jun. 27, 2019

(65) Prior Publication Data
US 2020/0382079 A1 Dec. 3, 2020

(30) Foreign Application Priority Data
Dec. 21, 2017 (GB) .................................... 1721651

(51) Int. Cl.
*H03F 3/183* (2006.01)
*H04R 1/02* (2006.01)
*H03G 3/30* (2006.01)

(52) U.S. Cl.
CPC .......... *H03F 3/183* (2013.01); *H03G 3/3005* (2013.01); *H04R 1/02* (2013.01); *H03F 2200/03* (2013.01); *H03G 2201/103* (2013.01)

(58) Field of Classification Search
CPC ...... H03F 2200/03; H03F 3/183; H03F 3/187; H03F 3/2171; H03G 2201/103;
(Continued)

(56) References Cited

U.S. PATENT DOCUMENTS

| 2017/0105068 A1* | 4/2017 | Lesso .................. H04R 29/003 |
| 2017/0289684 A1* | 10/2017 | Chang .................. H04R 1/403 |
| 2018/0160235 A1* | 6/2018 | Lesso .................. H03G 3/20 |

FOREIGN PATENT DOCUMENTS

| EP | 2852057 A1 | 3/2015 |
| WO | WO-2017137755 A2 | 8/2017 |

OTHER PUBLICATIONS

Zakharian, Andre; International Search Report; PCT/GB2018/053680; dated May 22, 2019; 6 pages.
(Continued)

*Primary Examiner* — Vivian C Chin
*Assistant Examiner* — Friedrich Fahnert
(74) *Attorney, Agent, or Firm* — Shackelford, Bowen, McKinley & Norton, LLP

(57) ABSTRACT

An electronic device comprises a speaker protection module (36) arranged to receive an audio signal (22) and to use one or more parameters relating to a loudspeaker to produce a controlled audio signal (34). An amplifier (40) is arranged to amplify the controlled audio signal to produce an amplified audio signal (24, 26) which is passed to the loudspeaker. The amplitude of the controlled audio signal (34) is such that the amplified audio signal (24, 26) is less than or equal to an amplitude determined to be safe for the loudspeaker in view of the one or more parameters. An ultrasound generator (16) is arranged to generate an ultrasound signal (30) that is mixed (32) with the controlled audio signal (34) before the controlled audio signal (34) is passed to the amplifier (40). The ultrasound generator (16) is capable of producing said ultrasound signal at a plurality of frequencies.

20 Claims, 10 Drawing Sheets

(58) Field of Classification Search
CPC ...... H03G 3/3005; H03G 3/301; H03G 7/002; H04M 1/6016; H04R 1/02; H04R 2430/01; H04R 3/007
USPC ........................................................ 381/107
See application file for complete search history.

(56) References Cited

OTHER PUBLICATIONS

Nxp Corp: "With Higher Dynamic Range & Fidelity Restitution Competitor TFA9892 Efficiency vs P OUT", Apr. 30, 2017, XP055570994, Retrieved from the Internet: URL:https://www.nxp.com/docs/en/fact-sheet/TFA9892FS.pdf [retrieved on Mar. 19, 2019].

\* cited by examiner

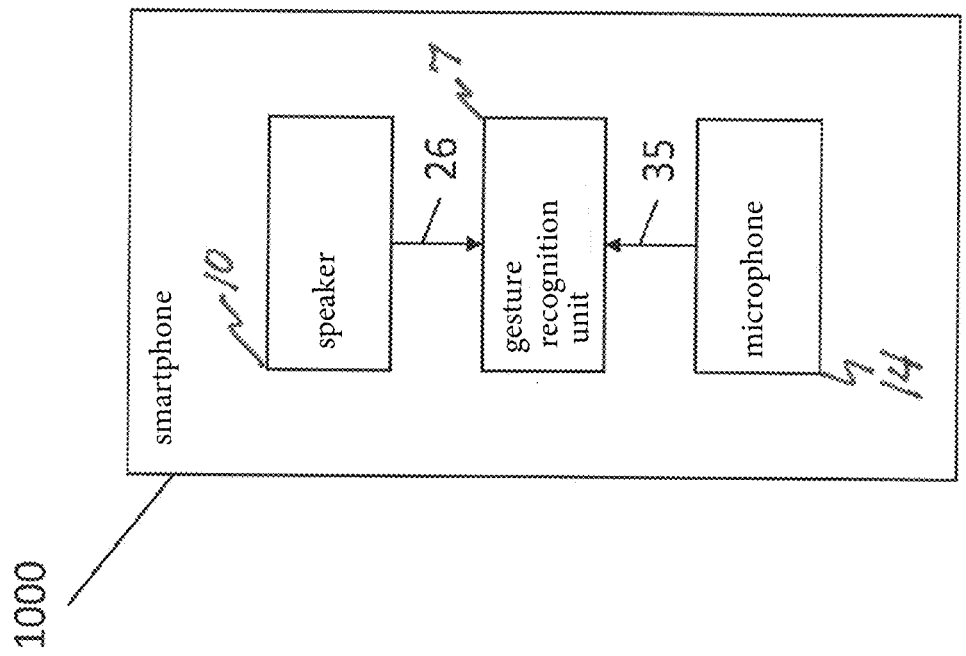

AUDIO AMPLIFIERS

The present invention relates to audio amplifiers, particularly to audio amplifiers provided in portable electronic devices.

Modern electronic devices such as smartphones and tablets are typically equipped with hardware to produce audible sounds, e.g. for playing multimedia content such as music and movies and for telecommunications such as phone calls. Generally, this hardware includes an amplifier—such as a power amplifier (PA)—that is arranged to receive an input signal (e.g. from a microprocessor, memory, storage medium, etc.) and amplify it so as to render it suitable for driving a loudspeaker.

Some such devices employ a "speaker protection module" (SPM) in order to protect the loudspeaker from being overdriven (that is from being driven with signals having too great an amplitude) in order to avoid damage of the loudspeaker whilst maximising the output which can be achieved. This is particularly important in mobile devices where size and weight are of critical importance. One example is the "Smart PA" range produced by NXP Semiconductors® which provides audio amplification and speaker protection functions on a single chip. Speaker protection modules like the Smart PA range monitor the output of the loudspeaker (e.g. by monitoring a signal indicative of the driving electrical power fed to the loudspeaker) and other local environmental factors such as the temperature and feed these into an algorithm that dynamically adjusts the speaker protection algorithm with a view to optimising the speaker protection such that the loudspeaker is not overdriven without subjecting the output to unnecessary limitations (e.g. limiting the amplitude of the audio output signal by more than is actually required), thus potentially allowing the loudspeaker to be driven as fully as conditions will allow at all times. Typically, such SPMs dynamically vary the gain of the audio amplifier according to the instantaneous input signal to achieve the protection described above. This can lead to a significant increase in the mean power output available compared to a speaker subject to a conservative static limit.

Typically, audio data that is to be output by the device via the loudspeaker passes from the source, which may be a microprocessor or a system-on-chip (SoC), through the speaker protection module before being amplified by the amplifier. The speaker protection module takes the input audio signal and produces a controlled audio that can be as high as the speaker can presently safely take after amplification. The amplified, controlled audio signal is then typically used to directly drive the loudspeaker. Providing the speaker protection module is properly calibrated, the loudspeaker is thus prevented from being overdriven.

The Applicant has appreciated, however, that the devices described above can be problematic if the amplifier is also to be used for ultrasonic applications, for example those that facilitate proximity detection or touchless interfaces (e.g. gesture-based inputs). These functions are typically reliant upon knowing the amplitude at which ultrasonic signals are transmitted in order to draw meaningful conclusions from reflections of these ultrasonic signals that are received by the device (e.g. by a microphone). For example, a determination of whether a user is holding their smartphone to their head may be made based on the relative signal strength of the received ultrasonic reflected signal compared to that of the transmitted ultrasonic signal. The Applicant has appreciated that, if the ultrasonic signal is passed through an amplifier employing speaker protection, employing dynamically-variable gain as set out above, processing of the received ultrasonic signals may not provide accurate results as the actual gain applied to the transmitted signals is unknown.

When viewed from a first aspect, the present invention provides an electronic device comprising:
 a first portion arranged to generate an audio signal;
 a loudspeaker;
 a speaker protection module arranged to receive said audio signal and to use one or more parameters relating to the loudspeaker to produce a controlled audio signal;
 an amplifier arranged to amplify at least said controlled audio signal to produce an amplified audio signal which is passed to the loudspeaker, an amplitude of the controlled audio signal being such that the amplified audio signal is less than or equal to an amplitude determined to be safe for the loudspeaker in view of the one or more parameters; and
 a second portion arranged to generate an ultrasound signal, said ultrasound signal being mixed with the controlled audio signal before the controlled audio signal is passed to the amplifier, wherein said second portion is capable of producing said ultrasound signal at a plurality of frequencies.

Those skilled in the art will appreciate that embodiments of the present invention provide a device particularly suited to applications where it is desirable to use ultrasonic signals (e.g. for proximity sensing or touchless user interactions) alongside conventional audio signals. By mixing the ultrasound signal with the controlled audio signal, i.e. downstream of the speaker protection module, rather than directly mixing it with the audio signal itself as would be conventional, the amplitude of the ultrasonic signal component is not altered by the speaker protection module. Thus, the ultrasound signal is not subjected to a potentially unknown gain at any point, meaning that the amplitude of the ultrasound signal (both before and after the amplifier, assuming the gain of the amplifier is known) is known within component tolerances. Advantageously, this allows more accurate application of algorithms for ultrasonic proximity and/or touchless user interface applications by using the known amplitude of the originally transmitted ultrasonic signal.

In some embodiments, the ultrasound signal is mixed in after the speaker protection module. By mixing the ultrasound signal with the controlled audio signal after the speaker protection module, the present invention can be applied more easily to existing device designs without needing to re-engineer such a device to enable the ultrasonic signal mixing functionality. In some embodiments, the device comprises a mixer arranged between the speaker protection module and the amplifier.

As discussed hereinabove, typical SPMs may monitor the output of the loudspeaker by monitoring a signal indicative of the driving electrical power fed to the loudspeaker. In such cases, the speaker protection will not be affected by mixing the ultrasound signal downstream of the SPM as the SPM monitors the total drive signal (i.e. the resultant mixed signal) being fed to the speaker. However, in other cases such monitoring of the total drive signal may be unavailable. As such, in some embodiments, the device is arranged to mix the ultrasound signal and the controlled audio signal in respective proportions such that the resultant mixed signal has an amplitude equal to or less than the amplitude of the controlled audio signal prior to mixing. Thus in such embodiments, adding the ultrasound signal downstream of the speaker protection module ensures that this mixing does not result in overdriving the loudspeaker.

In a set of such embodiments, an amplitude of the controlled audio signal is scaled by a first scaling factor and an amplitude of the ultrasound signal is scaled by a second scaling factor, wherein this scaling takes place prior to the mixing of said controlled audio and ultrasound signals. In a preferred set of such embodiments, the first and second scaling factors sum to one. These scaling factors may be chosen in order to prevent the loudspeaker from saturating due to the mixing in of the ultrasound signal. Typically, the second scaling factor may be related to the signal level required in a given use case where ultrasound is being used. The device may keep the signal level of the ultrasound constant at a given value of the scaling factor. As the actual audio level produced by the loudspeaker is usually selected by the user (e.g. using a volume button), the maximum level of the audio signal is (1−second scaling factor) multiplied by the audio level at the maximum volume setting. The audio level at the maximum volume setting is usually calculated and adapted by the protection algorithm.

In a set of embodiments, at least some of the second portion may selectively be enabled and disabled. This allows for the ultrasound generation system to be selectively turned on when required for a certain application or system state. For example if the device is a smartphone, the ultrasound generation and mixing may be enabled only if the smartphone is engaged in a telephone call, but otherwise disabled. This may provide savings in both power consumption and in processing requirements, both of which are advantageous, particularly in relation to portable electronic devices.

While ideally mitigated by the speaker protection module, it is sometimes possible that an undesirable "popping" noise can occur when the ultrasound signal is initiated due to the transient response of the system. In some embodiments, the second portion is arranged to apply a ramp up function to an amplitude of the ultrasound signal upon enabling said second portion. For example the amplitude of the ultrasound signal may be ramped up to the desired amplitude over a period of 0.1 to 100 ms. Preferably, the ramping is carried out over a period between 1 ms and 40 ms. This ramp up to the desired amplitude may start from an amplitude value sufficiently low so as not to cause this unwanted popping phenomenon, and preferably ramps up from an amplitude of zero or substantially zero. Similarly, this popping may occur when the ultrasound generation and mixing is stopped abruptly and thus in a potentially overlapping set of embodiments, the second portion is arranged to apply a ramp down function to an amplitude of the ultrasound signal upon disabling said second portion. For example, the amplitude of the ultrasound signal may be ramped down to the desired amplitude over a period between 0.1 and 100 ms, and is preferably ramped down over a period between 1 and 40 ms.

As stated previously, the second portion is capable of producing the ultrasound signal at a plurality of frequencies. While the second portion could produce the ultrasound signal at a single frequency selected from the available plurality of frequencies, which may be a set of discrete frequencies or a continuous range of frequencies, in a set of embodiments the second portion produces the ultrasound signal, wherein the ultrasound signal comprises a plurality of components having different frequencies selected from the plurality of frequencies. Thus, in accordance with such embodiments, the second portion may be capable of producing ultrasonic signals that are more complex than single frequency signals. More complex signals may advantageously make the processing of reflections of the ultrasonic signal easier—for example they may be less susceptible to noise and may be easier to distinguish from other signals.

In some embodiments, the ultrasound signal comprises at least one chirp. Those skilled in the art will appreciate that a chirp is a signal having a frequency that increases (an 'up-chirp') or decreases (a 'down-chirp') over time.

In some embodiments, the device is arranged to select a frequency of the ultrasound signal such that signal to noise ratio (SNR) of a received reflected ultrasound is improved. Such a selection of the frequency of a high SNR ultrasound signal may, by way of example only, be carried out by hopping between different ultrasonic frequencies, observing response of the system at said different frequencies to determine an SNR associated with each of said different frequencies, and selecting the ultrasound frequency that provided the highest SNR. The ultrasound frequency that provided the highest SNR may typically lie substantially away from the frequency of one or more noise signals.

In some embodiments, the second portion comprises a signal source arranged to generate the ultrasound signal. The signal source may, at least in some embodiments, comprise a hardware-based signal generator. However, additionally or alternatively, the signal generator may comprise a software module. The signal source may, for example, be a tone generator arranged to generate at least one tone. The signal or signals generated by the signal source may or may not be a pure sinusoid. For example, a signal generated by the signal source may be a 30 kHz sinusoidal signal with a relative weighting factor of 0.7 added to a periodic chirped signal, having frequencies spanning a range of frequencies, for example from 35 to 45 kHz. However, it will be appreciated that these values are merely examples and are not intended to be limiting on the scope of the invention and the weighting factor and/or the frequency span may also have other values as appropriate. The frequency of the signal, sinusoidal or otherwise, may be any frequency within the ultrasound range. Similarly, the frequency span may be any sub-range of the frequencies within the ultrasound range.

As will be appreciated by those skilled in the art, other methods for generating an ultrasound signal within the scope of the invention, detailed discussion of which is not essential to this disclosure. The embodiments related to the signal generation aspects explained herein are therefore provided only as non-limiting examples for ease of understanding.

In some embodiments, the second portion comprises a buffer storing data for generating said ultrasound signal, and a mechanism arranged to read said buffer repeatedly in order to generate a repeating ultrasound signal. For example, a number of ultrasonic signal fragments (i.e. signals of relatively short duration) may be stored in a buffer which may then be read cyclically such that each signal fragment is retrieved from the buffer and mixed with the controlled audio signal in turn.

When viewed from a second aspect, the present invention provides an electronic device comprising a buffer storing data for generating an ultrasound signal having a plurality of frequencies and a processing arrangement configured to read said buffer repeatedly and thereby to produce said ultrasound signal repeatedly, the device further being arranged to mix said ultrasound signal with an audio signal to produce a mixed signal and to pass said mixed signal to an amplifier have a predetermined gain.

In some embodiments of either of the foregoing aspects, the data fully represents said ultrasound signal. That is to say, the ultrasonic signal may be stored in the buffer directly, for example the ultrasonic signal may be represented digitally and this digital representation may be "divided up" and stored in the buffer. The buffer can then be read repeatedly such that the representation of the ultrasonic signal can be retrieved and, where necessary, converted to analogue form prior to mixing. It will of course be appreciated that the controlled audio signal and the ultrasonic signal may both be digital and mixed in the digital domain, or these signals may be analogue and mixed in the analogue domain.

While the data stored within the buffer could represent the ultrasound signal fully as described above, in an alternative set of embodiments of either of the foregoing aspects, the data only partially represents said ultrasound signal and the processing arrangement is arranged to use a look-up table to apply one or more of a scaling, symmetry or translation of the data to generate said signal. In such embodiments, the look-up table may be seen as a "library" of signal functions that can be used to construct the ultrasonic signal. The look-up table may have a number of different basic waveforms, e.g. a number of sinusoidal waveforms at different frequencies, wherein the processing arrangement may select one or more of these basic waveforms from the look-up table and optionally apply different transformations to generate more complex ultrasonic signals.

By way of non-limiting example, the processing arrangement may opt to construct a signal from a 30 kHz sinusoidal signal with a relative weighting of 0.7 added to a 45 kHz sinusoidal signal with a relative weighting of 0.3. The processing arrangement may also switch periodically or non-periodically between different ultrasonic signal constructions. For example, the ultrasonic signal may comprise the aforementioned weighted sum of 30 kHz and 45 kHz signals for half a period but the 45 kHz signal may be exchanged for a 50 kHz signal for the other half of the period. It will of course be understood that these are merely examples and any number of ultrasonic signals may be constructed through the appropriate use of scaling, symmetries, translations, additions, subtractions, etc.

When viewed from a third aspect, the present invention provides an electronic device comprising:
a first portion arranged to generate an audio signal;
a loudspeaker,
a speaker protection module arranged to receive said audio signal and to use one or more parameters relating to the loudspeaker to produce a controlled audio signal;
an amplifier arranged to amplify at least said controlled audio signal to produce an amplified audio signal which is passed to the loudspeaker, an amplitude of the controlled audio signal being such that the amplified audio signal is less than or equal to an amplitude determined to be safe for the loudspeaker in view of the one or more parameters; and
a second portion arranged to generate an ultrasound signal, said ultrasound signal being mixed with the controlled audio signal before the controlled audio signal is passed to the amplifier.

Those skilled in the art will appreciate that the optional features described hereinabove in relation to embodiments of the first or second aspects of the invention apply equally, where appropriate, to the third aspect of the invention.

While the ultrasound signal may be mixed in after (i.e. downstream of) the SPM, the Applicant has appreciated that the mixing may alternatively be performed upstream of the SPM. Thus, when viewed from a fourth aspect, the present invention provides an electronic device comprising:
a first portion arranged to generate an audio signal;
a loudspeaker,
a speaker protection module arranged to receive said audio signal and to use one or more parameters relating to the loudspeaker to produce a controlled audio signal;
an amplifier arranged to amplify at least said controlled audio signal to produce an amplified audio signal which is passed to the loudspeaker, an amplitude of the controlled audio signal being such that the amplified audio signal is less than or equal to an amplitude determined to be safe for the loudspeaker in view of the one or more parameters; and
a second portion arranged to generate an ultrasound signal, said ultrasound signal being mixed with the audio signal before the controlled audio signal is produced by the speaker protection module, wherein said second portion is capable of producing said ultrasound signal at a plurality of frequencies;
wherein the device is arranged to produce a compensation signal comprising information relating to a gain applied to the ultrasound signal and wherein the device uses the compensation signal to compensate for the gain applied to the ultrasound signal.

It will be appreciated by those skilled in the art that, in accordance with this fourth aspect of the invention, the ultrasound signal may be mixed with the audio signal in the SPM or upstream of the SPM. For example, the device may use an algorithm employed by the speaker protection module to perform the mixing. The compensation signal may then be used by downstream components to compensate for the variance in the gain applied to the ultrasound signal.

Those skilled in the art will appreciate that the optional features described hereinabove in relation to embodiments of the first or second aspects of the invention apply equally, where appropriate, to the fourth aspect of the invention. Certain embodiments of the present invention will now be described with reference to the accompanying drawings in which:

FIG. 10 is a block diagram of a smartphone that utilises an amplifier architecture in accordance with an embodiment of the present invention.

Figure 1:
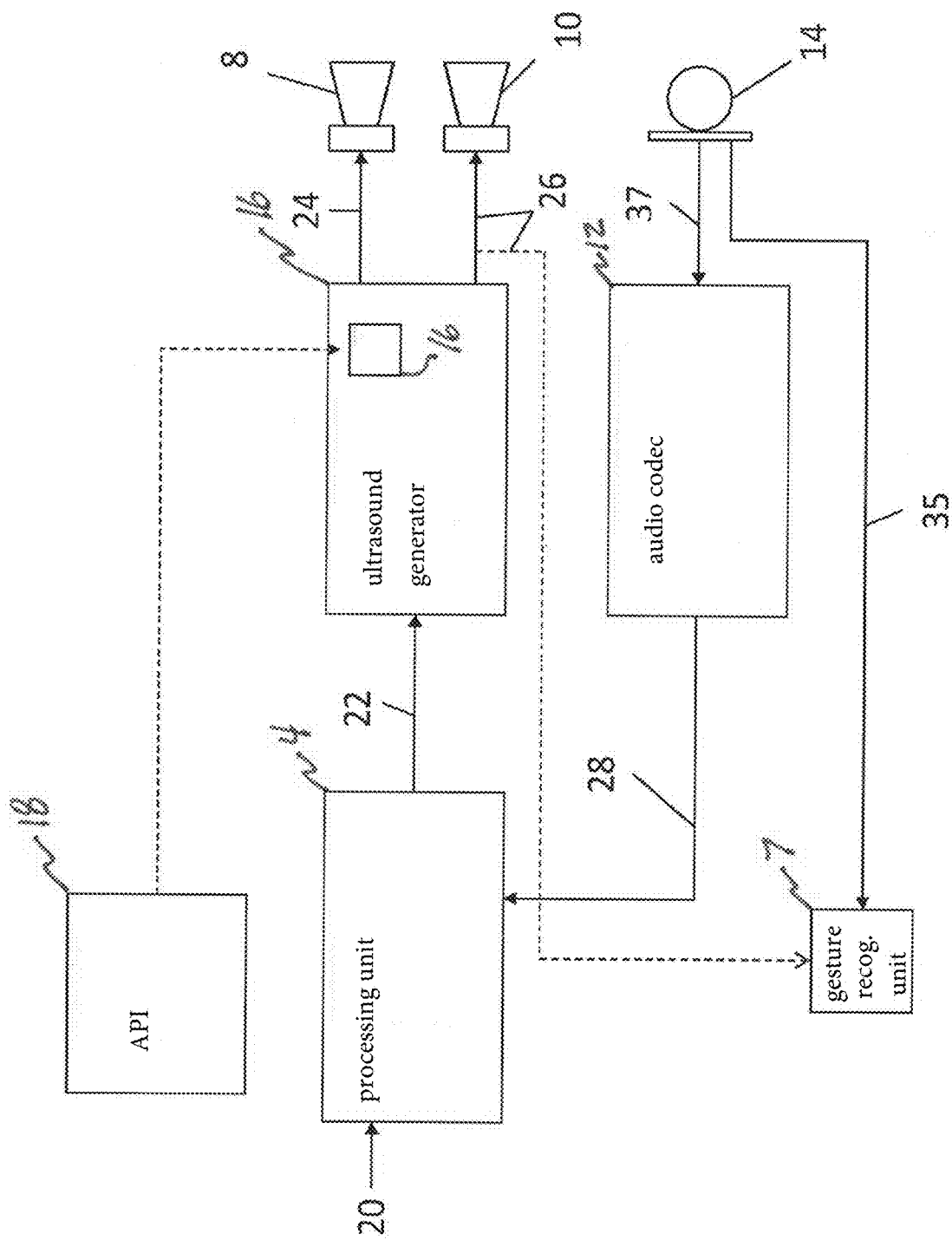
FIG. 1 is a block diagram of an amplifier architecture in accordance with an embodiment of the present invention.
Figure 2:
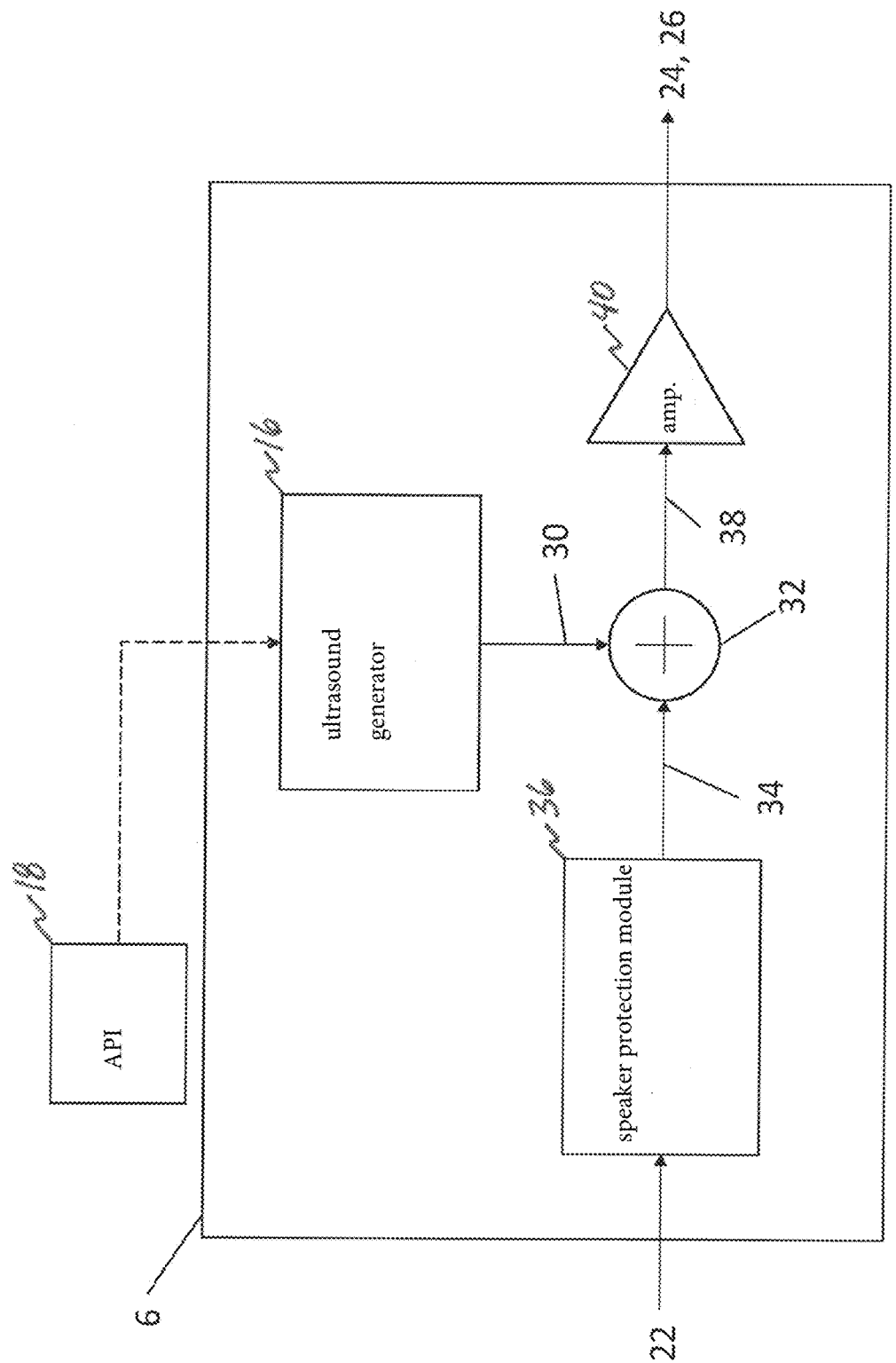
FIG. 2 is a block diagram illustrating the mixing process that takes place within the power amplifier of FIG. 1.

FIGS. 1 and 2 are block diagrams of an amplifier architecture in accordance with an embodiment of the present invention. In practice, the amplifier will be implemented within an electronic device such as a mobile phone, a tablet, a laptop, etc. The amplifier architecture comprises: a processing unit 4, such as a digital signal processor (DSP) which may, for example, be a Hexagon™ DSP produced by Qualcomm®; a power amplifier 6 which may, for example, be a Smart PA produced by NXP Semiconductors®; a receiver 8; a loudspeaker 10; an audio codec 12 which may be the WCD codec specified by Qualcomm®; and a microphone 14. The power amplifier 6 comprises an ultrasound generator 16 which can be controlled via an application programming interface (API) 18. The function of each of these components will be described in detail below.

For simplicity, the terms processing unit 4 and DSP are used interchangeably in this disclosure. It will be appreciated that the processing unit may also be realised using a microprocessor, a microcontroller or the like having at least one processing core. Any analogue signal processing blocks may either be located on the same chip with the at least one processing core, or the processing system may be realised as a System on Chip (SoC), a Multichip module (MCM), or even an Application Specific Integrated Circuit (ASIC). Typically an SPM may include an embedded internal DSP which may be software-programmable. Such a DSP may be configured to different specifications in order to be suitable for a certain end-use. The DSP within the SPM is normally used to configure the SPM to match the receiver 8 or loudspeaker 10 it is connected to and to provide the capability to update the SPM algorithm in the future if required. However, it may be the case that a separate processor or DSP is used to process signals from the microphone 14, and this is discussed in further detail below.

Similarly, the audio codec 12 (shown as a single block for simplicity) may also be realised using any type of audio processor that uses a microprocessor, a microcontroller or the like having at least one processing core. Thus, the audio codec 12 may also be an audio processor.

The processing unit 4 and audio codec 12 could be collocated on the same block or chip as will be described later with reference to FIGS. 8 and 9. The term 'audio processor' is not limiting to the scope or frequency range of the audio processor block 12, i.e. the use of this term does not imply that the operation of the audio processor 12 is limited to the processing of just signals within an audible frequency range.

For the sake of clarity, it should be understood that in the technical field of telephony, an earpiece speaker in the handset (i.e. the part that the user listens to in use) is commonly called a 'receiver' whereas the microphone in the handset is called a 'transmitter'. Accordingly, in a typical mobile telephone, the receiver 8 will correspond to an earpiece speaker, whereas the loudspeaker 10 will correspond to a handsfree speaker. This, however, does not affect the generality of the present invention. The receiver 8 and loudspeaker 10 may thus refer to a plurality of speakers in an electronic device using the amplifier architectures in the embodiments of the invention as outlined herein.

Furthermore, as will be appreciated, the invention does not require both the receiver 8 and the speaker 10 to carry out ultrasonic operations. A single speaker may be sufficient to implement embodiments of the invention. Some low-cost electronic devices or mobile phones may only have a single earpiece speaker and not a handsfree speaker. In at least some of such devices, the same receiver 8 may be used both as an earpiece speaker and as a loudspeaker 10, depending, for example, on how a user is operating the electronic device.

For example a smartphone 1000 as shown in FIG. 10, may utilise the speaker 10 and the microphone 14 to provide inputs to a gesture recognition unit 7 (which might form part of the DSP 4). Specifically, the speaker 10 provides its output signal 26 that contains ultrasonic components as described below and the microphone 14 provides a signal 35 that contains reflections of the ultrasonic components. The gesture recognition unit 7 may compare these signals 26, 35 to determine an input gesture to the smartphone 1000 made by a user. It will of course be appreciated that the signal provided by the speaker 10 may not necessarily be the actual signal 26 output by the speaker 10 and may be an unamplified version produced by circuitry upstream of the speaker 10 that is indicative of the output amplitude of ultrasonic signals transmitted by the speaker 10.

Such a device may use both the receiver 8 and the loudspeaker 10 for extracting spatial information from the reflected ultrasound signals. Since the receiver 8 and loudspeaker 10 are typically located at different locations on the device, spatial information or a relative location of the reflecting object with respect of the locations of the receiver 8 and the loudspeaker 10 can potentially be determined from reflections from an object of the signals transmitted by each of the receiver 8 and the loudspeaker 10. Furthermore, devices having more than two speakers may be able to extract additional spatial information and/or may be able to improve the spatial information extraction carried out using the receiver 8 and the loudspeaker 10.

Similarly, the microphone 14 may actually be a package including a plurality of microphone transducers. If the plurality of microphones are placed at different locations in the electronic device, reception of echo signals at respective microphones may be used to extract/improve spatial information. This may be in addition to or alternatively to the methods described above that utilise multiple speakers.

The processing unit or DSP 4 is arranged to receive an input signal 20 which may, for example, be a pulse code modulated (PCM) signal. The DSP 4 processes this input signal 20 and produces an output signal 22 suitable for input to the power amplifier 6. This signal 22 may also be a PCM signal and can be passed from the DSP 4 to the power amplifier 6 via an inter-integrated circuit or "inter-IC" sound ($I^2S$) bus which, as will be understood by those skilled in the art, is an electrical serial bus interface standard that is used for connecting digital audio devices together. The power amplifier 6 is arranged to process this signal 22 in order to generate signals 24, 26 suitable for driving the receiver speaker 8 and the loudspeaker 10 respectively as will be described in further detail below.

The microphone 14 is arranged to pick up audio signals produced by the speakers 8, 10 and convert these into an electrical signal 37 that is input to the codec 12. The codec produces a digital signal 28 that is input to the DSP 4.

The digital signal 28 shown in FIG. 1 is a feedback signal, however as will be described below, it could instead be a feedforward control signal, depending on how the amplifier architecture is realised. Examples of embodiments that use feedforward control are described later with reference to FIGS. 7 and 9.

The digital signal 28 may even be or comprise a bidirectional signal or a communication link. As a few non-limiting examples, the digital signal 28 may further be used such that the receiving system activates or deactivates the transmitting system part (e.g. the receiver 8 and/or the loudspeaker 10) if the receiving parts (e.g. the microphone 14) determine that there are people talking nearby, if someone has entered the room, or if the noise level changes.

Additionally or alternatively, the receiving system may change the waveform of the transmitting system, depending on the distance measured to a person in the room. Also, in addition or in the alternative, the receiving system may change the amplitude of the audible part, so that a user can change the volume of sound played, for example, by using a gesture.

In this example, the audio processing is carried out by the audio processor or codec 12. In case when the signal processing of the signal received by the microphone 14 is done in the audio processor 12, the digital signal 28 may be a feedback signal. The processing unit 4 and the audio processor 12 may be hardware separated processors, or software separated modules running on the same processor. In alternative arrangements, the digital signal may instead be a bidirectional signal or a communication link or bus between the processing unit 4 and the audio processor 12.

This digital feedback signal 28 may be used by the DSP 4 to characterise the performance of the speakers 8, 10 and to adjust one or more parameters of the output signal 22 it produces in response. For example, if the processing unit or DSP 4 determines that the speakers 8, 10 are saturated or close to being saturated in any specific situation, it may adjust the gain used to generate the signal 22 so as to reduce the amplitude of the signals 24, 26 being applied to the speakers 8, 10. Conversely, if the DSP 4 determines that the audio signals produced by the speakers 8, 10 are below the tolerable maximum for the present circumstances, the gain may safely be increased to maximise speaker output. The feedback signal 28 may also be a PCM signal and may be conveyed to the DSP 4 via a serial low-power inter-chip media bus (SLIMbus).

In some arrangements, processing of the signal received by the microphone 14 may be partially but not fully carried out by the audio processor 12. In such arrangements, the signal 28 from the microphone may comprise audio data and the audio processor may convert the signals received at the microphone 14 to a digital data stream and send the stream in or as a digital signal 28.

The ultrasound generator 16 within the power amplifier 6 is arranged to produce an ultrasound signal 30 (see FIG. 2) that is added to a controlled audio signal 34 produced which is produced from the output signal 22 produced by the DSP 4 as described in detail below. The ultrasound signal produced by the ultrasound generator 16 can take many different forms e.g. the frequency, signal envelope, amplitude, periodicity, etc. may be set by a user as desired. The ultrasound control API 18 is arranged to provide an interface to the ultrasound generator 16 such that one or more of these parameters may be set as desired. For example, in the simple case where the ultrasound generator 16 is arranged to provide an ultrasound signal with a single, user-variable frequency, the API 18 provides a mechanism for the user to choose the frequency. Similarly, where the ultrasound generator 16 is arranged to provide a multi-frequency ultrasound signal, the frequencies and/or the relative amplitudes of the various frequency components may be set by the user using the API 18. However, there are typically many more parameters regarding the ultrasound signal that may be set by the API 18. These parameters are discussed in further detail later.

FIG. 2 is a block diagram illustrating the mixing process that takes place within the power amplifier 6. The ultrasound signal 30 produced by the ultrasound generator 16 is mixed, using a mixer 32, with a controlled audio signal 34 produced by a speaker protection module 36. The speaker protection module 36 is arranged to receive the output signal 22 produced by the DSP 4 and control it such that it does not saturate the speakers 8, 10.

Figure 3:
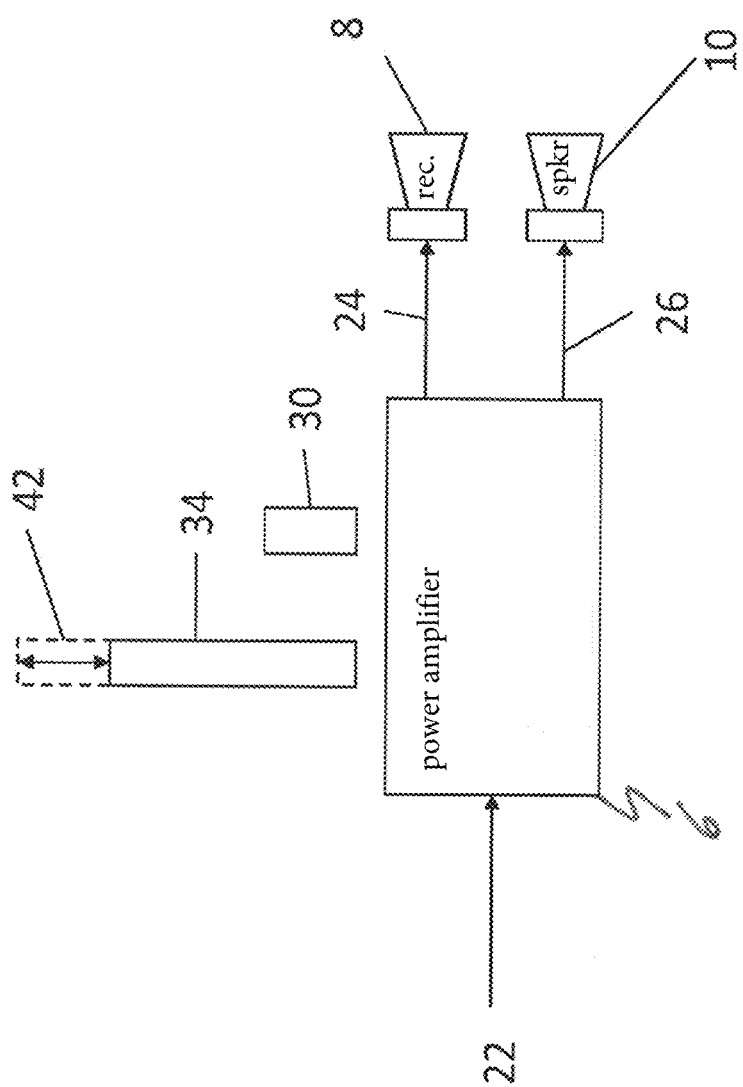
FIG. 3 illustrates the difference in amplitude variability between the ultrasound signal and the controlled audio signal of FIG. 1.

The mixer 32 produces a mixed audio signal 38 having both the normal audible components (e.g. audible music signals) having a controlled amplitude and the ultrasound components having a constant amplitude. As discussed previously, the ultrasound component(s) usually have a constant amplitude for a given use case or operational mode. However, while it is assumed here that the ultrasound components have a constant amplitude for the sake of simplicity, in practice the ultrasound component(s) may be configured to have different amplitudes when the operational mode changes. The mixed audio signal 38 is input to an amplifier 40 which produces the output signals 24, 26 that are used to drive the speakers 8, 10 as required. This difference in amplitude variability between the ultrasound signal 30 and the controlled audio signal 34 is illustrated in FIG. 3. It can be seen in FIG. 3 that the ultrasound signal 30 is of fixed amplitude, while the controlled audio signal 34 can vary by a certain amount 42.

As explained above, there are a number of parameters regarding the ultrasound signal 30 that can be set using the API 18. A non-exhaustive list of these can be seen below:

1) Frequency: the frequency or frequencies of the ultrasound signal 30.
2) Amplitude: the amplitude of the ultrasound signal 30 or, where the ultrasound signal 30 is a multi-frequency signal, the amplitude components of the various frequency components of the ultrasound signal 30.
3) Alpha value: the relative weighting of the ultrasound signal 30 and the controlled audio signal 34. The alpha value is typically a value between 0 and 1 such that the amplitude of the ultrasound signal 30 is multiplied by the alpha value and the amplitude of the controlled audio signal 34 is multiplied by 1 minus the alpha value. This can be used to ensure that the mixed audio signal 38 does not result in saturation of the speakers 8, 10.
4) Enable ultrasound mixing: this is a binary value (0 or 1) that determines whether the ultrasound mixing hardware is enabled or not. For example, if the ultrasound functionality is not required in a given situation, it may be disabled in order to conserve power.
5) Enable ramping: in order to prevent unwanted "popping" noises at the speakers 8, 10, it may be preferable to prevent abrupt changes when the ultrasound functionality is switched on or off. By enabling the ramping functionality using the API 18, the power amplifier 6 may apply a ramp to the amplitude of the ultrasound signal 30 such that the ultrasound signal 30 is faded in and/or out when the ultrasound functionality is enabled and/or disabled respectively. For example, the ultrasound signal 30 may be ramped from an initial amplitude of 0 (or close to 0) to the desired amplitude over the course of 0.1 to 100 ms upon enabling the ultrasound hardware. Conversely, the amplitude of the ultrasound signal 30 may be ramped down from its normal amplitude to 0 (or close to 0) over the course of 0.1 to 100 ms upon disabling the ultrasound hardware.
6) Enable ultrasound output signal: this parameter is an on/off switch that enables or disables the ultrasound output signal as appropriate.

As described previously, the ultrasound generator 16 is arranged to produce the ultrasound signal 30 that is added to the output signal 22. This ultrasound generator 16 may be a purely hardware-based signal generator (e.g. a tone generator), however additionally alternatively, the signal generator 16 may be wholly or partly software-based. The ultrasound generator 16 may, in some embodiments, be arranged to generate a signal at a single frequency, e.g. a pure sinusoidal signal, or it may be arranged to produce a signal that is a more complex combination of different frequency components.

In some embodiments, the ultrasound signal comprises at least one chirp. Those skilled in the art will appreciate that a chirp is a signal having a frequency that increases (an 'up-chirp') or decreases (a 'down-chirp') over time.

In some embodiments, the device is arranged to select a frequency of the ultrasound signal such that signal to noise ratio (SNR) of a received reflected ultrasound is improved. Such a selection of the frequency of a high SNR ultrasound signal may, by way of example only, be carried out by hopping between different ultrasonic frequencies, observing response of the system at said different frequencies to determine an SNR associated with each of said different frequencies, and selecting the ultrasound frequency that provided the highest SNR. The ultrasound frequency that provided the highest SNR may typically lie substantially away from the frequency of one or more noise signals.

The signal source may, for example, be a tone generator arranged to generate at least one tone. The signal or signals generated by the signal source may or may not be a pure sinusoid. For example, a signal generated by the signal source may be a 30 kHz sinusoidal signal with a relative weighting factor of 0.7 added to a periodic chirped signal, having frequencies spanning a range of frequencies, for example from 35 to 45 kHz. However, it will be appreciated that these values are merely exemplary and are not intended to be limiting on the scope of the invention and the weighting factor and/or the frequency span may also have other values as appropriate. The frequency of the signal, sinusoidal or otherwise, may be any frequency within the ultrasound range. Similarly, the frequency span may be any sub-range of the frequencies within the ultrasound range.

However, while in the embodiments described above the ultrasound generator 16 directly generates the ultrasound signal 30, in some alternative embodiments the ultrasound generator 16 may instead comprise a buffer 43 in which pre-generated signals or signal portions are stored and used to construct the ultrasound signal 30. In order to facilitate this, the API may be provided with an additional parameter, 'Set ultrasound output buffer'. This parameter that can be set by the API 18 can be used to enable a buffer that is used by the ultrasound generator 16 to produce the ultrasound signal 30. This buffer will be described in further detail with reference to FIGS. 4-6 below.

Figure 4:
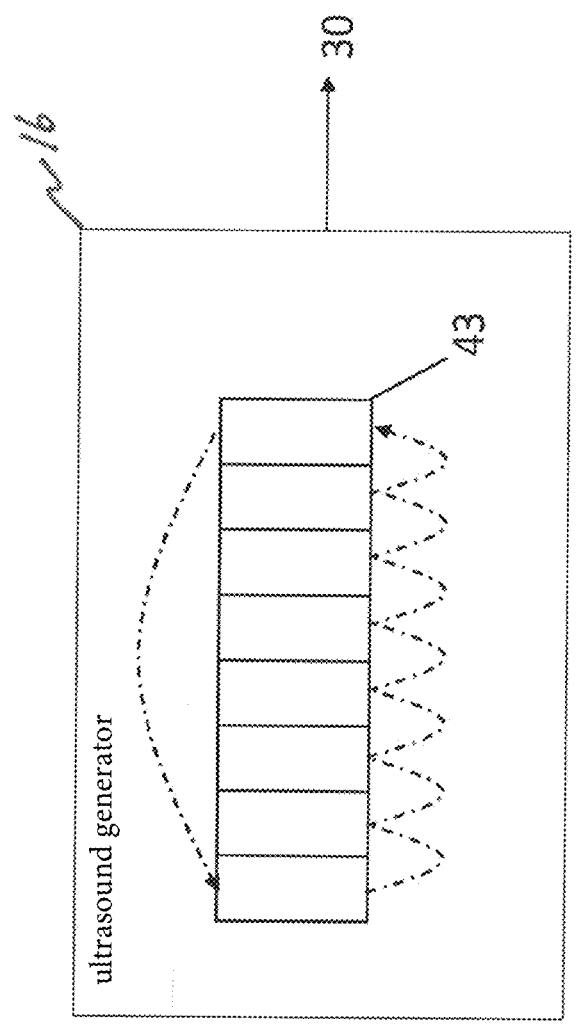
FIG. 4 is a block diagram of a playout buffer in accordance with an embodiment of the present invention.
Figure 5:
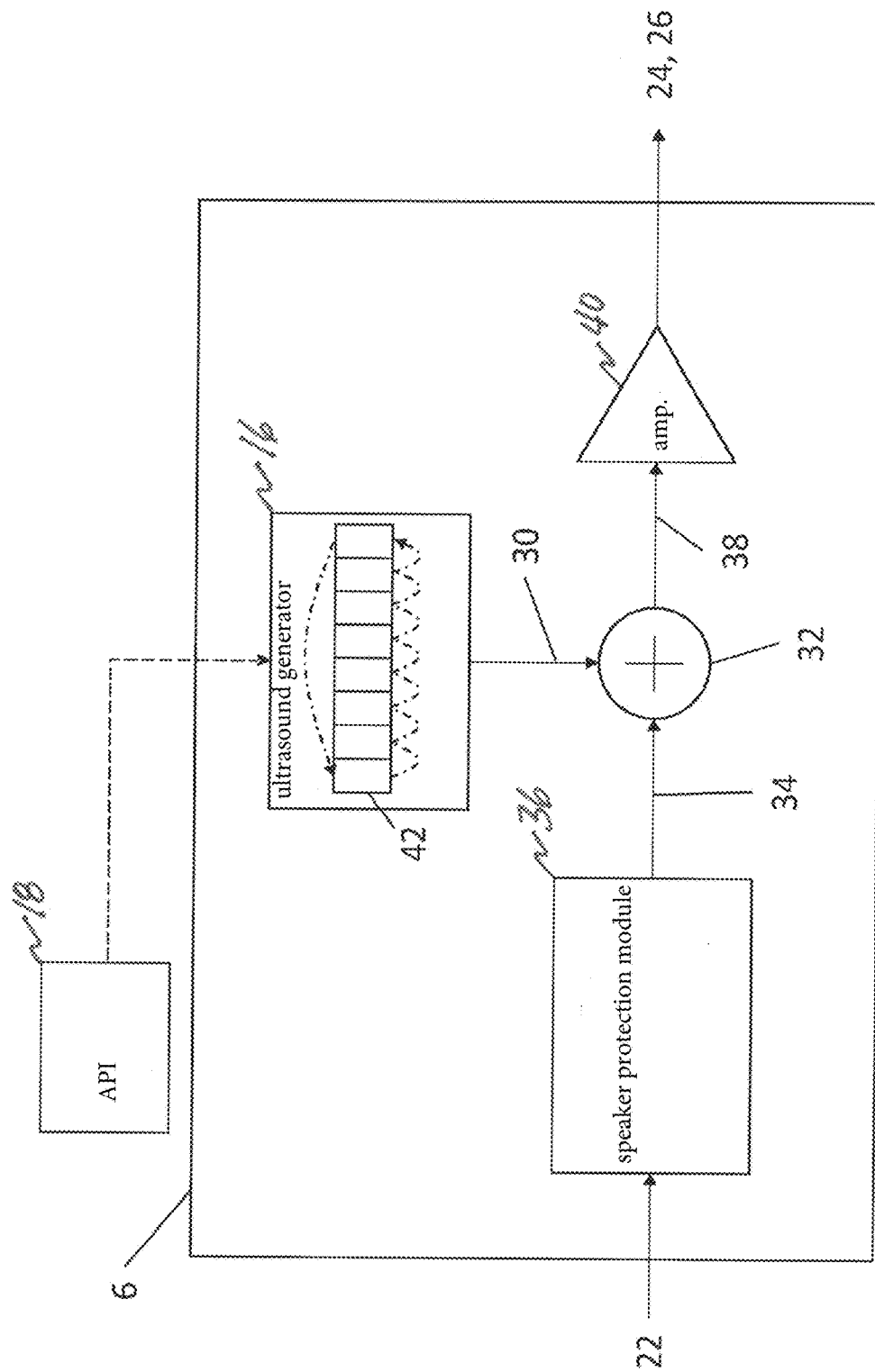
FIG. 5 is a block diagram showing the playout buffer of FIG. 4 used within the mixing process of FIG. 2.

FIG. 4 is a block diagram of a playout buffer 42 as outlined above. This playout buffer 42 forms part of the ultrasound generator 16 that is used to produce the ultrasound signal 30. This ultrasound buffer 42 is used to construct the ultrasound signal 30 using one of several possible mechanisms. In the simplest case, the playout buffer 42 is used to store a digital representation of a desired ultrasound signal and the playout buffer 42 is read cyclically such that the data stored at each position within the buffer 42 is read in turn (e.g. from left to right) before looping back to the beginning so as to generate a periodic output signal, i.e. the ultrasound signal 30. However, the buffer 42 may be arranged to provide more complex ultrasound signals as will be described in further detail below. The buffer 42 within the ultrasound generator 16 is shown within the context of the rest of the power amplifier 6 in FIG. 5, where the rest of the structure of the power amplifier 6 is as described previously with reference to FIG. 2.

Figure 6:
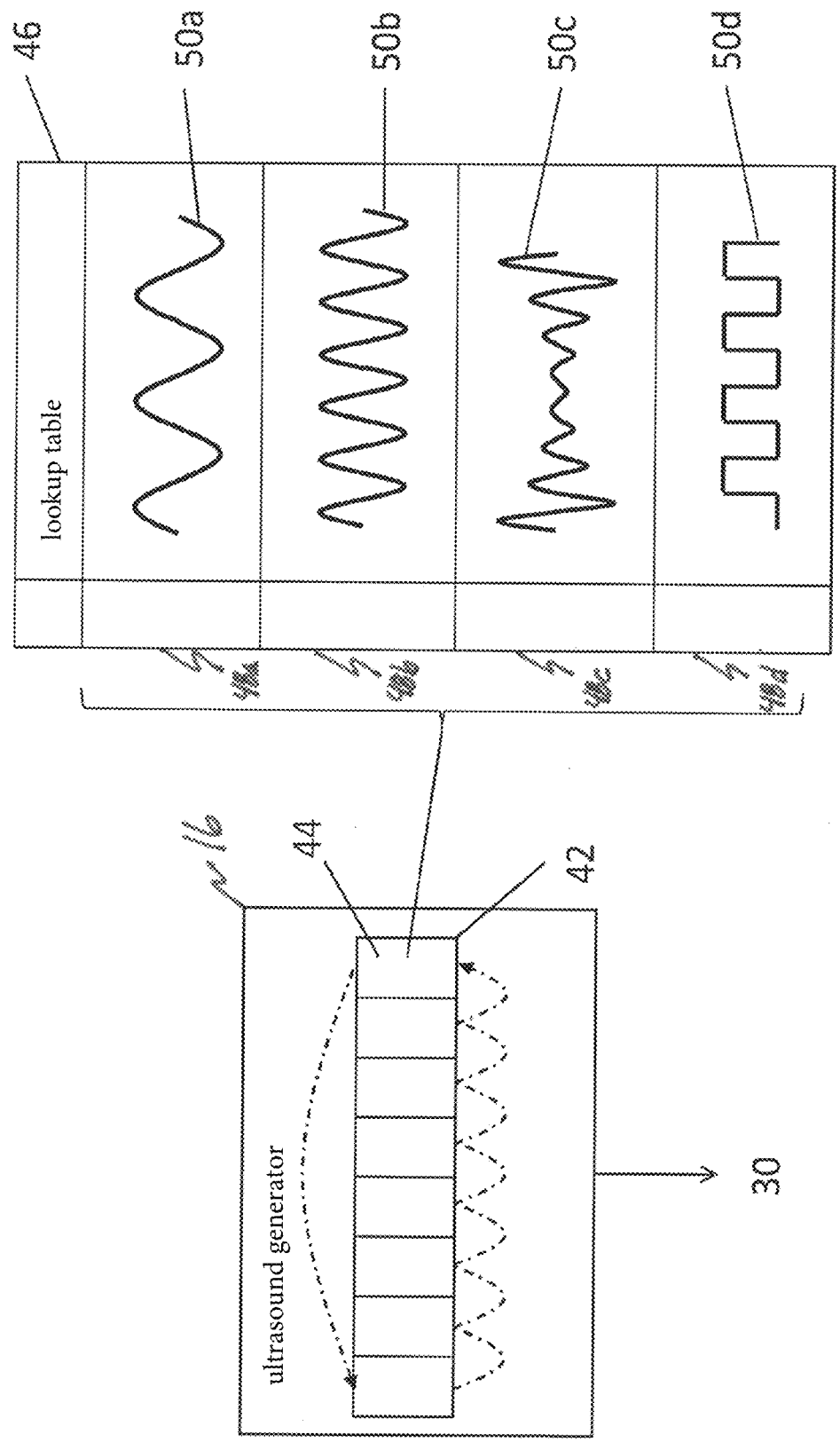
FIG. 6 illustrates the buffer when used to produce more complex ultrasound signals using a lookup table.

FIG. 6 illustrates the buffer 42 when used to produce more complex ultrasound signals using a lookup table 46. The lookup table 46 stores a number of "signal fragments" 50a-d that can be used as building blocks to construct more complex signals. For ease of illustration, the lookup table 46 shown in FIG. 6 is shown to store four different signal fragments. On a first line 48a of the lookup table 46, a basic sinusoidal waveform 50a at a particular frequency is stored, while on the second line 48b of the lookup table 46, a different sinusoidal waveform 50b having a second, different frequency is stored. The third line 48c of the lookup table 46 stores an amplitude modulated waveform 50c with a constant frequency but an amplitude that periodically varies over time. The fourth line 48d of the lookup table 46 stores a square wave 50d. At each position 44 within the buffer 42, an index value corresponding to one of these lines 48a-d is stored. As the buffer 42 is read, the ultrasound generator 16 produces the output signal 30 as a reconstruction of the appropriate signal fragments 50a-d that are indexed at the corresponding positions 44.

These signal fragments 50a-d may be modified in order to generate the ultrasound signal 30. For example, a particular position 44 within the buffer 42 may instruct the ultrasound generator 16 to produce the first signal fragment 50a but at seven times the amplitude. Alternatively, the signal fragments 50a-d may be combined, e.g. a certain position 44 may instruct the ultrasound generator 16 to produce as the ultrasound signal 30 the addition of the second signal fragment 50b and the third signal fragment 50c. It will be appreciated by those skilled in the art that any such combinations are possible, and other modifications may be made to the signal fragments 50a-d such as translations, phase shifts, amplitude variations, convolutions, additions, subtractions, etc.

Figure 7:
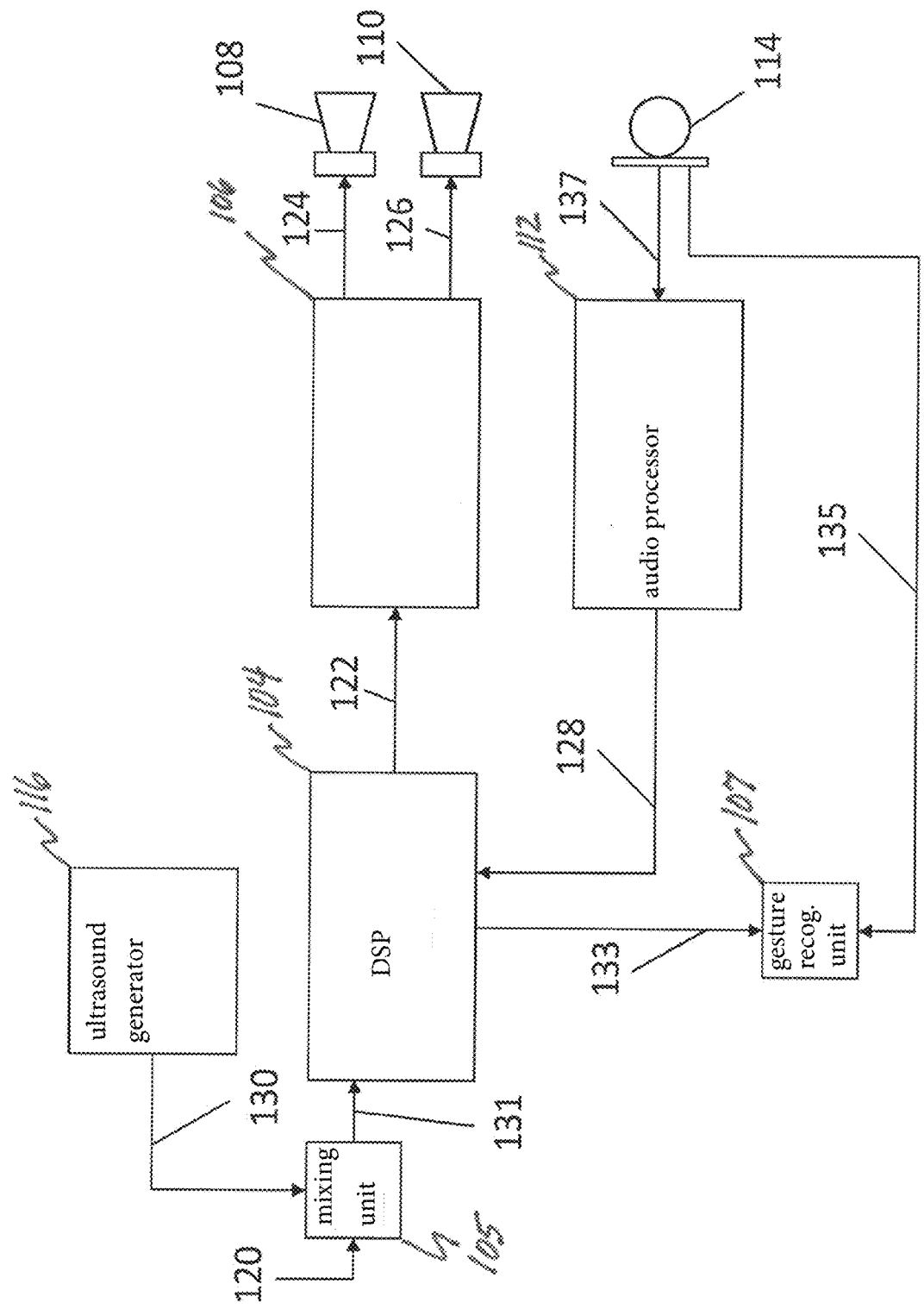
FIG. 7 is a block diagram of an amplifier architecture that uses feedforward control in accordance with a further embodiment of the present invention.

FIG. 7 is a block diagram of an amplifier architecture that uses feedforward control in accordance with a further embodiment of the present invention.

In this embodiment, the ultrasound signal 130 is mixed with the audio input signal 120 within or upstream of the SPM (i.e. within or upstream of the DSP 104) by an upstream mixing unit 105. The mixing unit 105 itself may be an independent mixer or might be part of an algorithm employed by the SPM.

This upstream mixing unit 105 mixes the ultrasound signal 130 produced by the ultrasound generator 116 with the audio input signal 120 in order to produce a mixed audio signal 131 that is used by the DSP 104 to produce the controlled audio signal 122. However, unlike the arrangement described previously with reference to FIG. 1, the controlled audio signal 122 contains both audible and ultrasonic components.

As the ultrasound signal 130 is mixed in before the gain is applied, the SPM applies gain adjustments to the ultrasonic components as well as the audible components. it produces a 'feedforward' compensation signal 133 that provides downstream components with information regarding the amplitude of the ultrasonic components of the controlled audio signal 122. This information can, for example, be used by a gesture recognition unit 107 (which might form part of the DSP 104) when comparing the amplitude of transmitted ultrasonic signals to the received ultrasonic reflections 135. This compensation information may be stored for later use or may be encoded into the transmitted signals themselves, e.g. using a particular series of chirps.

Similarly to the arrangement of FIG. 1, the microphone 114 provides an audio signal 137 that the audio processor 112 uses to provide a digital feedback signal 128 to the DSP 104 that is used by the DSP to characterise the loudspeakers 108, 110 and to control the gain applied in order to produce the controlled audio signal 122.

Figure 8:
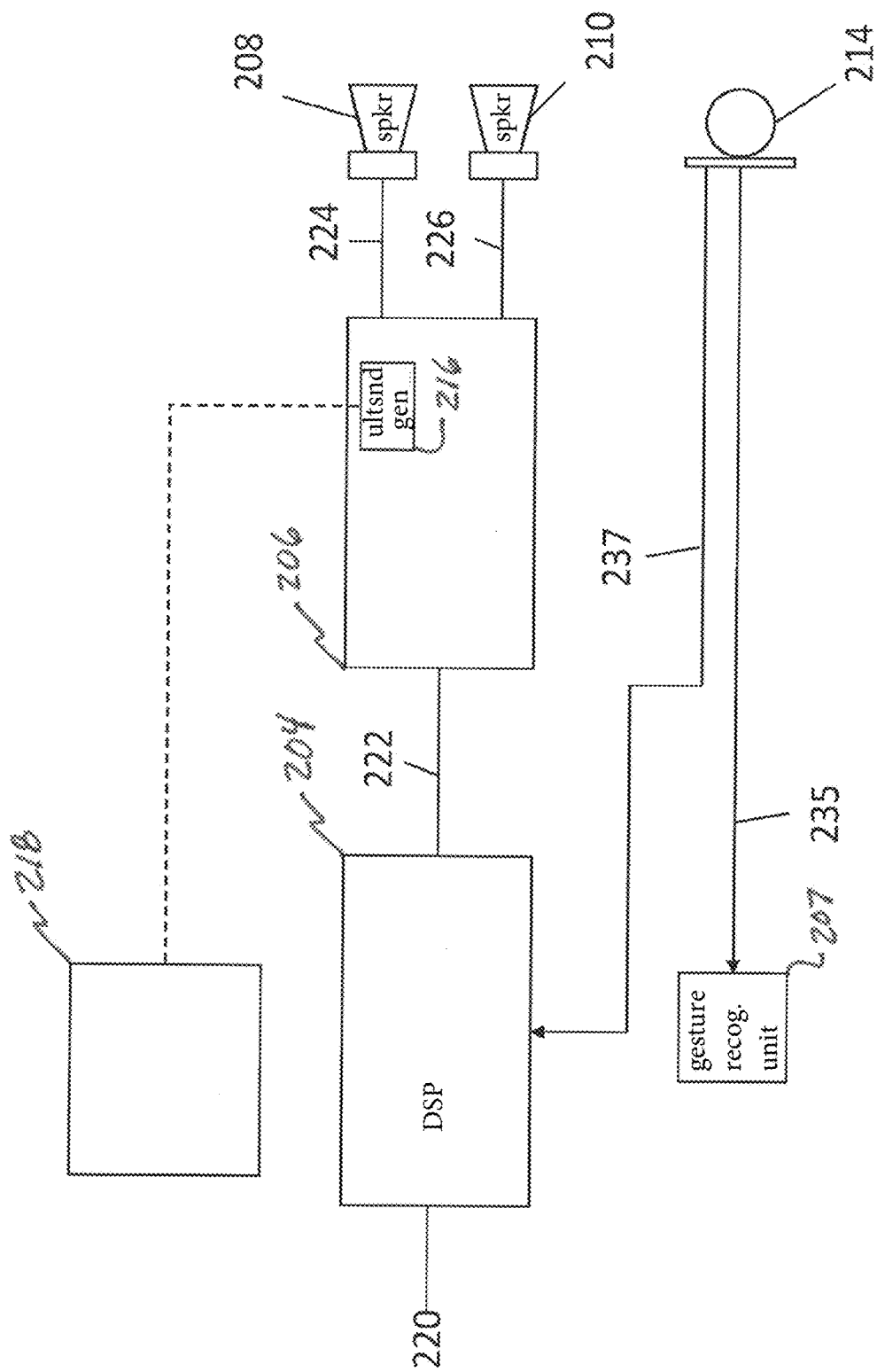
FIG. 8 is a block diagram of an amplifier architecture where the processing unit and audio codec are collocated in accordance with a further embodiment of the present invention.

FIG. 8 is a block diagram of an amplifier architecture where the processing unit and audio codec are collocated in accordance with a further embodiment of the present invention, where reference numerals beginning with '2' are used to indicate the same elements that have reference numerals beginning with '1' in FIG. 7. In this embodiment, the audio codec exists within the processing unit or DSP 204, such that there is no separate, discrete component that processes the signals 237 from the microphone 214 that are used to characterise the loudspeakers 208, 210. Further audio signals 235 corresponding to reflections of the transmitted ultrasonic signals received by the microphone 214 are input to a gesture recognition unit 207 (which might form part of the DSP 104) which compares the amplitude of transmitted ultrasonic signals to the received ultrasonic reflections 235.

Figure 9:
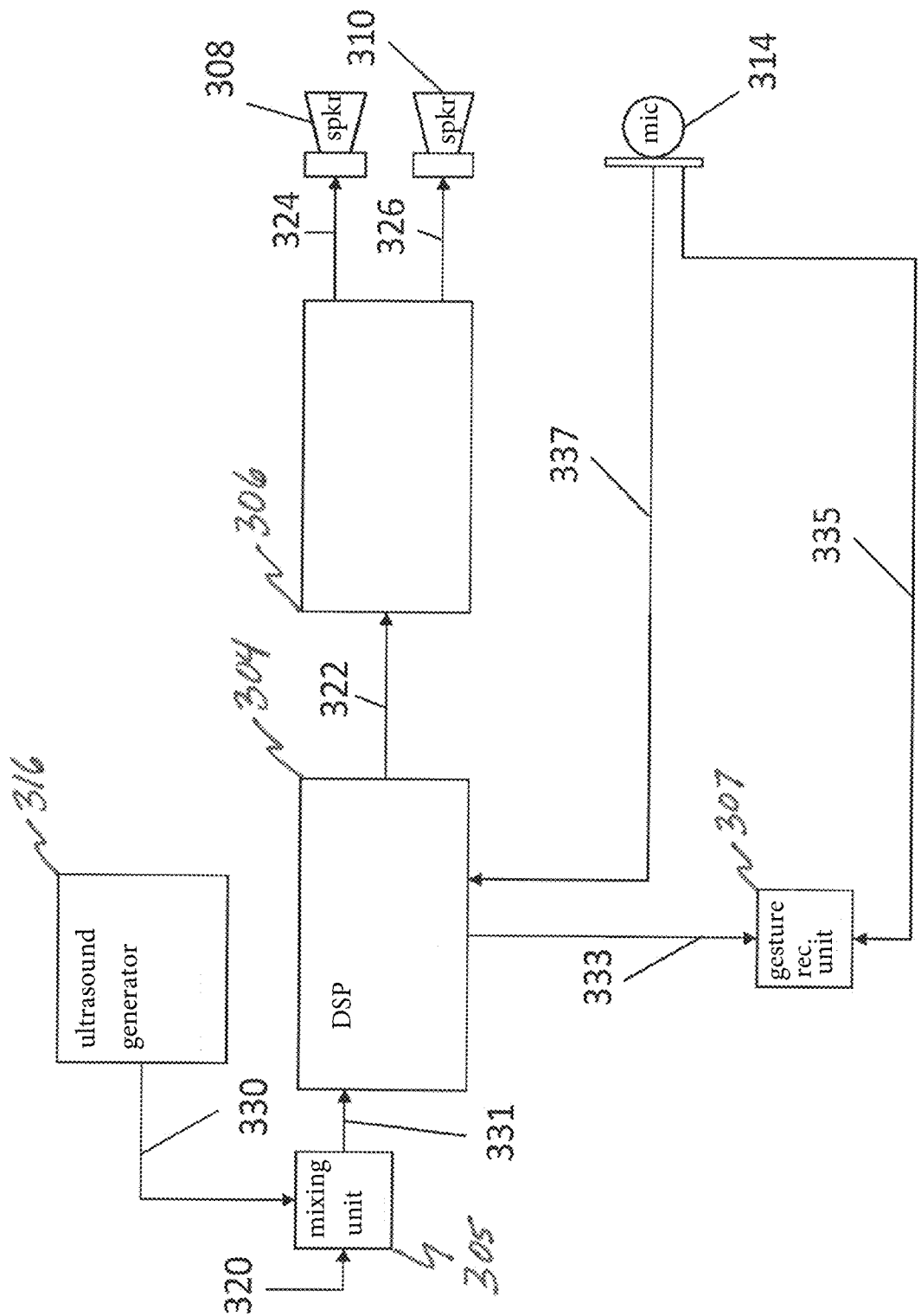
FIG. 9 is a block diagram of an amplifier architecture that uses feedforward control and where the processing unit and audio codec are collocated in accordance with a further embodiment of the present invention.

FIG. 9 is a block diagram of an amplifier architecture that uses feedforward control and where the processing unit and audio codec are collocated in accordance with a further embodiment of the present invention, where reference numerals beginning with '3' are used to indicate the same elements that have reference numerals beginning with '1' in FIG. 7.

The architecture shown in FIG. 9 may therefore be seen as a combination of the embodiments described with reference to FIGS. 7 and 8, where the audio codec exists within the processing unit or DSP 304, such that there is no separate, discrete component that processes signals from the microphone 314 and where a feedforward control signal 333 is provided by the DSP 304 indicating to downstream circuitry what variable gain has been applied to the ultrasonic components of the mixed audio signal 322.

Thus it will be appreciated by those skilled in the art that embodiments of the present invention provide an improved audio amplifier arrangement wherein ultrasound signals can be mixed in with normal audible signals within amplifiers that employer speaker protection mechanisms. It will be appreciated by those skilled in the art that the embodiments described above are merely exemplary and are not limiting on the scope of the invention.

The invention claimed is:

1. An electronic device comprising:
a first portion arranged to generate an audio signal;
a loudspeaker;
a speaker protection module arranged to receive the audio signal and to use one or more parameters relating to the loudspeaker to produce a controlled audio signal;
an amplifier arranged to amplify at least the controlled audio signal to produce an amplified audio signal which is passed to the loudspeaker, an amplitude of the controlled audio signal being such that the amplified audio signal is less than or equal to an amplitude determined to be safe for the loudspeaker in view of the one or more parameters;
a second portion arranged to generate an ultrasound signal, said ultrasound signal being mixed with the controlled audio signal before the controlled audio signal is passed to the amplifier, wherein the second portion is capable of producing the ultrasound signal at a plurality of frequencies; and
wherein the ultrasound signal is mixed in after the speaker protection module.

2. The electronic device as claimed in claim 1, wherein the electronic device comprises a mixer arranged between the speaker protection module and the amplifier, the mixer being arranged to mix the ultrasound signal with the controlled audio signal.

3. The electronic device as claimed in claim 1, wherein at least some of the second portion is arranged to be selectively enabled and disabled.

4. The electronic device as claimed in claim 1, wherein the second portion is arranged to apply a ramp up function to an amplitude of the ultrasound signal upon enabling said second portion.

5. The electronic device as claimed in claim 1, wherein the second portion is arranged to apply a ramp down function to an amplitude of the ultrasound signal upon disabling said second portion.

6. The electronic device as claimed in claim 1, wherein the second portion produces the ultrasound signal, wherein the ultrasound signal comprises a plurality of components having different frequencies selected from the plurality of frequencies.

7. The electronic device as claimed in claim 1, wherein the ultrasound signal comprises at least one chirp.

8. The electronic device as claimed in claim 1, arranged to:
hop between a plurality of different ultrasonic frequencies;
observe a response at each of the plurality of different ultrasonic frequencies to determine a signal-to-noise ratio associated with each of the different frequencies; and
select the ultrasonic frequency that provided the highest signal-to-noise ratio.

9. The electronic device as claimed in claim 1, wherein the second portion comprises a signal source arranged to generate the ultrasound signal.

10. The electronic device as claimed in claim 9, wherein the signal source comprises a hardware-based signal generator.

11. The electronic device as claimed in claim 9, wherein the signal source comprises a software module.

12. An electronic device comprising:
a first portion arranged to generate an audio signal;
a loudspeaker;
a speaker protection module arranged to receive the audio signal and to use one or more parameters relating to the loudspeaker to produce a controlled audio signal;
an amplifier arranged to amplify at least the controlled audio signal to produce an amplified audio signal which is passed to the loudspeaker, an amplitude of the controlled audio signal being such that the amplified audio signal is less than or equal to an amplitude determined to be safe for the loudspeaker in view of the one or more parameters;
a second portion arranged to generate an ultrasound signal, said ultrasound signal being mixed with the controlled audio signal before the controlled audio signal is passed to the amplifier, wherein the second portion is capable of producing the ultrasound signal at a plurality of frequencies; and
wherein the electronic device is arranged to mix the ultrasound signal and the controlled audio signal in respective proportions such that the resultant mixed signal has an amplitude equal to or less than the amplitude of the controlled audio signal prior to mixing.

13. The electronic device as claimed in claim 12, wherein an amplitude of the controlled audio signal is scaled by a first scaling factor and an amplitude of the ultrasound signal is scaled by a second scaling factor, wherein the scaling of the controlled audio and ultrasound signals takes place prior to the mixing of the controlled audio and ultrasound signals.

14. The electronic device as claimed in claim 13, wherein the first and second scaling factors sum to one.

15. The electronic device as claimed in claim 12, wherein at least some of the second portion is arranged to be selectively enabled and disabled.

16. The electronic device as claimed in claim 12, wherein the second portion is arranged to apply a ramp up function to an amplitude of the ultrasound signal upon enabling said second portion.

17. The electronic device as claimed in claim 12, wherein the second portion is arranged to apply a ramp down function to an amplitude of the ultrasound signal upon disabling said second portion.

18. The electronic device as claimed in claim 12, wherein the second portion produces the ultrasound signal, wherein the ultrasound signal comprises a plurality of components having different frequencies selected from the plurality of frequencies.

19. An electronic device comprising:
   a first portion arranged to generate an audio signal;
   a loudspeaker;
   a speaker protection module arranged to receive the audio signal and to use one or more parameters relating to the loudspeaker to produce a controlled audio signal;
   an amplifier arranged to amplify at least the controlled audio signal to produce an amplified audio signal which is passed to the loudspeaker, an amplitude of the controlled audio signal being such that the amplified audio signal is less than or equal to an amplitude determined to be safe for the loudspeaker in view of the one or more parameters;
   a second portion arranged to generate an ultrasound signal, said ultrasound signal being mixed with the controlled audio signal before the controlled audio signal is passed to the amplifier, wherein the second portion is capable of producing the ultrasound signal at a plurality of frequencies;
   wherein the second portion comprises a buffer storing data for generating the ultrasound signal, and a mechanism arranged to read the buffer repeatedly in order to generate a repeating ultrasound signal; and
   wherein the data only partially represents the ultrasound signal and the mechanism is arranged to use a look-up table to apply one or more of a scaling, symmetry or translation of the data to generate the signal.

20. The electronic device as claimed in claim 19, wherein the data fully represents the ultrasound signal.

* * * * *